US 6,686,651 B1

(12) United States Patent
Foster

(10) Patent No.: US 6,686,651 B1
(45) Date of Patent: Feb. 3, 2004

(54) MULTI-LAYER LEADFRAME STRUCTURE

(75) Inventor: Donald Craig Foster, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/996,226

(22) Filed: Nov. 27, 2001

(51) Int. Cl.[7] .......................................... H01L 23/495
(52) U.S. Cl. ...................... 257/666; 257/692; 257/773
(58) Field of Search ............................. 257/666, 692, 257/773, 670, 671, 672, 673, 688, 690, 696, 700; 438/123

(56) References Cited

U.S. PATENT DOCUMENTS

| | | | |
|---|---|---|---|
| 5,124,783 A | 6/1992 | Sawaya | |
| 5,168,368 A | * 12/1992 | Gow et al. ................... | 257/666 |
| 5,451,812 A | 9/1995 | Gomi | |
| 5,462,624 A | 10/1995 | Kwon ......................... | 156/257 |
| 5,498,901 A | * 3/1996 | Chillara et al. .............. | 257/666 |
| 5,521,429 A | 5/1996 | Aono et al. .................. | 257/676 |
| 5,723,899 A | 3/1998 | Shin ........................... | 257/666 |
| 5,864,173 A | 1/1999 | Fogelson .................... | 257/666 |
| 5,929,513 A | 7/1999 | Asano et al. ................ | 257/675 |
| 5,977,630 A | 11/1999 | Woodworth et al. ........ | 257/712 |
| 5,994,768 A | 11/1999 | Fogelson .................... | 257/666 |
| 6,025,640 A | 2/2000 | Yagi et al. ................... | 257/666 |
| 6,066,888 A | * 5/2000 | Yanagisawa ................. | 257/668 |
| 6,087,204 A | 7/2000 | Fogelson .................... | 438/123 |
| 6,104,084 A | 8/2000 | Ishio et al. | |
| 6,130,115 A | 10/2000 | Okumura et al. ........... | 438/124 |
| 6,143,981 A | 11/2000 | Glenn ........................ | 174/52.4 |
| 6,198,171 B1 | 3/2001 | Huang et al. ............... | 257/787 |
| 6,225,146 B1 | 5/2001 | Yamaguchi et al. ........ | 438/123 |
| 6,229,200 B1 | 5/2001 | Mclellan et al. ............ | 257/666 |
| 6,242,281 B1 | 6/2001 | Mclellan et al. ............ | 438/106 |
| 6,258,629 B1 | 7/2001 | Niones et al. | |
| 6,281,568 B1 | 8/2001 | Glenn et al. ................ | 257/684 |
| 2002/0102831 A1 | * 8/2002 | Hui et al. ................... | 438/611 |
| 2002/0180008 A1 | * 12/2002 | Corisis ....................... | 257/666 |

FOREIGN PATENT DOCUMENTS

| | | |
|---|---|---|
| DE | 19734794 A1 | 7/1998 |
| EP | 0794572 A2 | 9/1997 |
| JP | 59-227143 | 12/1984 |
| JP | 60-195957 | 10/1985 |
| JP | 7-312405 | 11/1995 |
| JP | 8-125066 | 5/1996 |
| JP | 8-306853 | 11/1996 |
| JP | 9-8205 | 1/1997 |
| JP | 9-8206 | 1/1997 |
| JP | 9-8207 | 1/1997 |
| JP | 9-92775 | 4/1997 |

* cited by examiner

*Primary Examiner*—Tom Thomas
*Assistant Examiner*—Douglas W. Owens
(74) *Attorney, Agent, or Firm*—Bever, Hoffman & Harms, LLP; James E. Parsons

(57) ABSTRACT

A leadframe and a package including the leadframe are disclosed. At least one lead includes a nonconductive layer on the inner end segment of the lead set back from its inner end. An electrically conductive layer is on a surface of the nonconductive layer. The nonconductive layer electrically isolates the electrically conductive layer from the lead upon which the nonconductive layer is positioned. The lead itself and the electrically conductive layer thereon are separately available for electrical connection to a semiconductor chip. The electrically conductive layer in turn may be electrically coupled to a second lead, with the electrically conductive layer serving as a bridge for an electrical connection between the chip and the second lead.

46 Claims, 14 Drawing Sheets

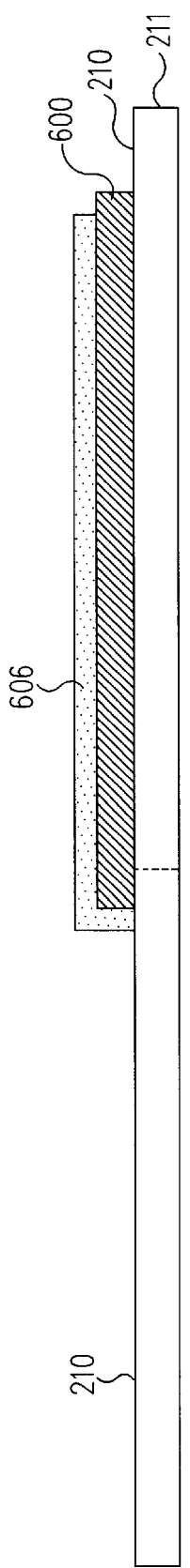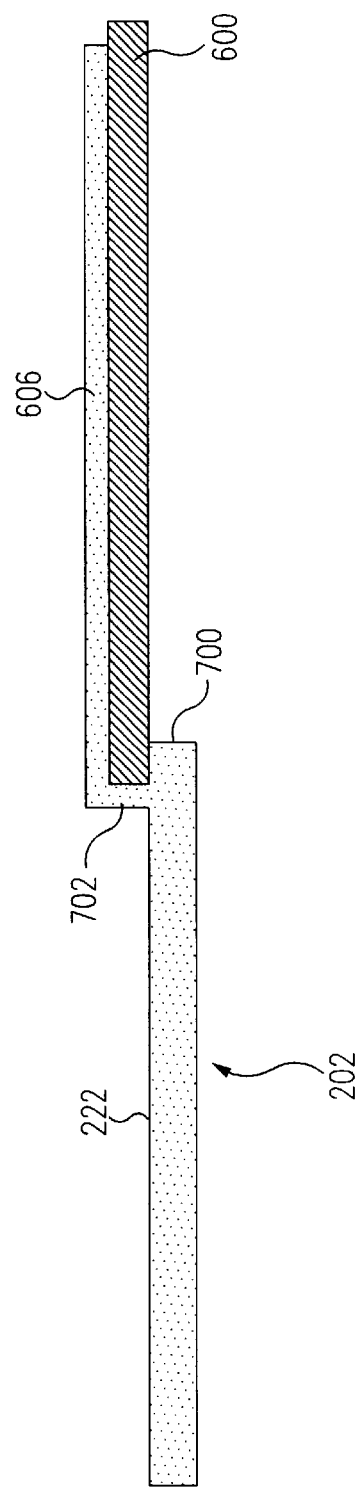
FIG. 7A
FIG. 7B

MULTI-LAYER LEADFRAME STRUCTURE

BACKGROUND

1. Field of the Invention

The present invention relates to packages for semiconductor chips or other electronic devices.

2. Background Information

A typical package for a semiconductor chip includes an internal metal leadframe, which functions as a substrate for the package. The leadframe includes a central die pad and a plurality of leads that radiate outward from the die pad. A hardened, insulation encapsulant material covers the chip, die pad, and an inner portion of each of the leads.

The semiconductor chip is mounted on the die pad and is electrically connected to the leads. In particular, the chip includes a plurality of bond pads, each of which is electrically connected by a bond wire or the like to a bond finger that is at an inner end of one of the leads. An outer portion of each lead extends outward from the encapsulant, and serves as an input/output terminal for the package. The outer portion of the leads may be bent into various configurations, such as a J lead configuration or a gull wing configuration.

In the market for semiconductor packaging today, there is a trend toward decreasing the size of leadframes and packages. This is driven by semiconductor chip size reductions that accompany each new generation of fabrication processes. As the chip size shrinks, so must either the bond finger pitch, or the number of bond fingers located proximate to the die pad, otherwise wire lengths get too long and mold yield suffers due to wire sweep.

Reducing the number of bond fingers located proximate to the die pad can be difficult. This is especially true given that, as the size of a semiconductor chip decreases, the number of electrical connections it requires does not. Accordingly, an improved method of making a leadframe is desirable.

SUMMARY

An exemplary embodiment of the present invention is a leadframe that provides both short leads and long leads. The short leads are situated within unused space that is created between the long leads as the long leads fan out towards the outer edges of the leadframe. The inner end segments of the longer leads are adapted to accommodate two or more electrical connections, and these added electrical connections are then routed back to the short leads. The resulting leadframe requires less inner end segments proximate to the die pad and allows for the creation of smaller leadframes. Correspondingly smaller packages can be made with such leadframes than is achievable with leadframes made only by conventional methods.

In accordance with one embodiment of the invention, a leadframe comprises a plurality of metal leads extending from a metal frame, each lead including an inner end segment beginning at an inner end of the lead, a nonconductive layer on the inner end segment of at least one of the leads and set back from its inner end, and an electrically conductive layer on a surface of the nonconductive layer and generally parallel to a longitudinal direction of the inner end segment, wherein the nonconductive layer electrically isolates the electrically conductive layer from the respective lead upon which the nonconductive layer is positioned. In some embodiments, the inner end segment of each of a first subset of the leads extends further toward a center of the lead frame than the inner end segment of each of a second subset of the leads.

The present invention is best understood by reference to the following detailed description when read in conjunction with the accompanying drawings.

DESCRIPTION OF THE DRAWINGS

FIG. 7A is a side view of the leads and conductive elements shown in FIG. 6A.

FIG. 7B is a side view of the leads and conductive elements shown in FIG. 6A, wherein some leads are not shown for clarity.

Common reference numerals are used throughout the drawings and detailed description to indicate like elements.

DETAILED DESCRIPTION

Figure 1:
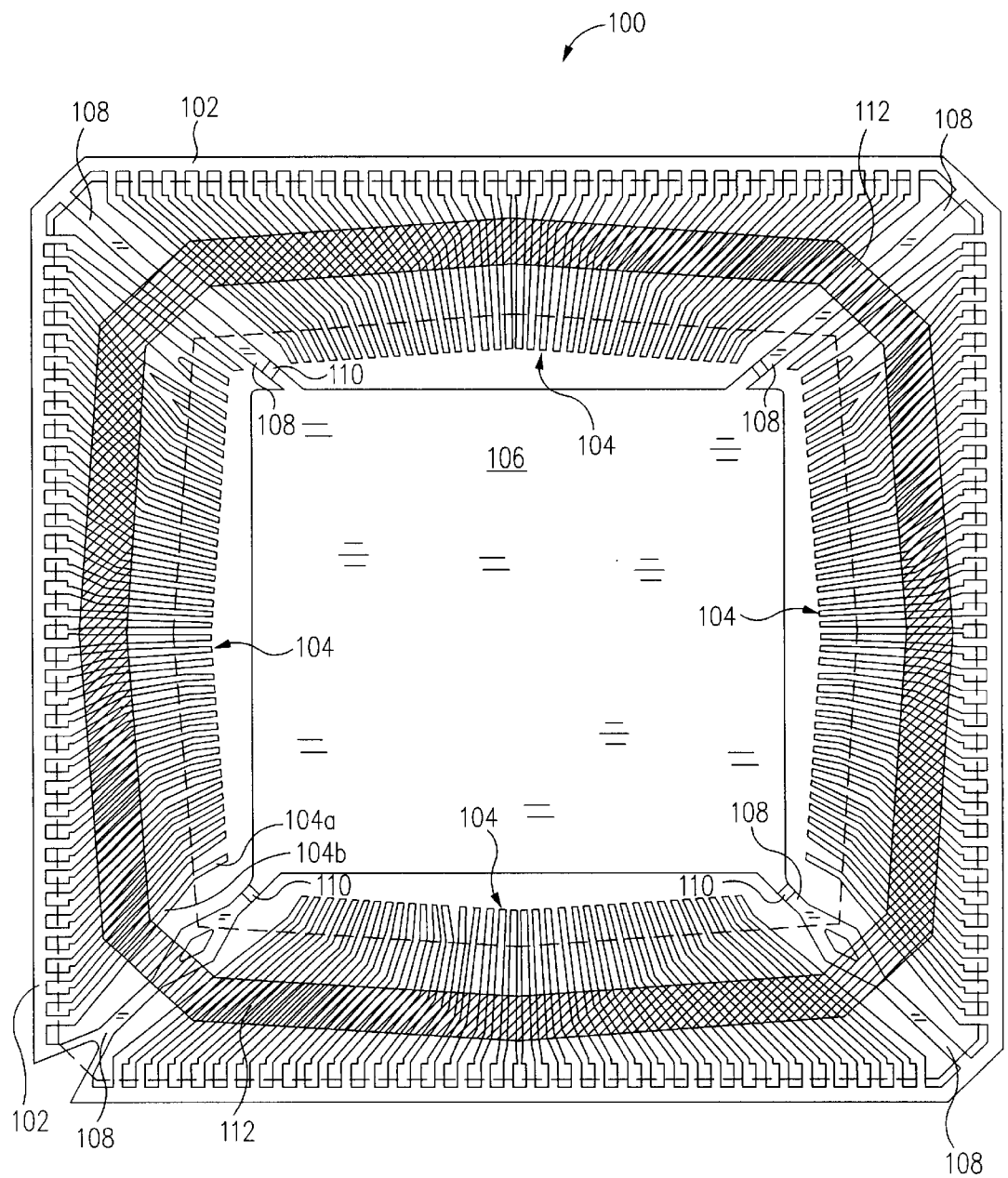
FIG. 1 is a plan view of a leadframe.

FIG. 1 is a top plan view of a portion of a leadframe 100 that will provide context for the discussion below. Practitioners will appreciate that the techniques of the present invention may be used to make leadframes having a wide variety of configurations. Accordingly, the overall configuration of leadframe 100 is exemplary only.

Leadframe 100 is formed from a metal, such as copper. Other metals also can be used, including, but not limited to, copper alloys, plated copper, plated copper alloys, copper plated steel, Alloy 42, Alloy 37, or any other material that is conductive and can be used for making leadframes. Typically, a plurality of leadframes are formed in a contiguous metal sheet, and the leadframes of the sheet are processed through package assembly in strip form.

Leadframe 100 includes a closed internal frame, denoted as dam bar 102, that supports a plurality of leads 104 and a planar rectangular die pad 106. Although not shown in FIG. 1, leads 104 may extend outward beyond dam bar 102. In such a case, the portion of leads 104 inside of dam bar 102 would be called "inner leads," and the portion of leads 104 outside of dam bar 102 would be called "outer leads." The portion of leads 104 within dam bar 102 is encapsulated later in the assembly process.

Die pad 106 is at a central region of leadframe 100 and serves as a base upon which a semiconductor chip is ultimately mounted. Each of the four corners of die pad 106 is connected by a tie bar 108 to dam bar 102. A downset 110 is provided in tie bars 108 so that die pad 106 is vertically below leads 104. Dam bar 102 will be severed from leads 104 and tie bars 108 after an encapsulation step during package assembly, thereby leaving the package with a plurality of encapsulated leads 104 that are electrically isolated from each other.

Leads 104 extend inward from dam bar 102 toward all four sides of die pad 106, as in a quad package. Each lead 104 has an inner end segment, denoted herein as bond finger 104a, that is proximate to die pad 106, and a longer, outer second portion 104b that is between bond finger 104a and dam bar 102. In FIG. 1, bond fingers 104a are shown within the dashed line. Ultimately, the bond finger 104a of each of the leads 104 is electrically connected by a bond wire, tab, or some other electrical conductor to the semiconductor chip that is to be mounted on die pad 106 (see, e.g., FIG. 3). Typically, bond fingers 104a of leads 104 are plated with silver or some other common metal to facilitate connection to the bond wire or other conductor that extends to the chip. A nonconductive adhesive strip 112, which may be formed of polyimide, may be applied in a ring onto second portion 104b of leads 104 for stability during processing and to maintain leads 104 at proper positions relative to one another. This can help to prevent two adjacent leads 104 from bending.

As mentioned, leadframe 100 is normally formed from a solid rectangular metal sheet that is patterned to create the configuration shown in FIG. 1. Conventionally, the patterning process involves either a chemical etching process or a mechanical stamping process.

A typical chemical etching process uses photolithography, a photoresist mask, and a metal-dissolving liquid chemical to etch a pattern into the metal sheet that is being used to make leadframe 100. The liquid chemical etches away all portions of the metal sheet not masked by the photoresist mask, leaving behind the desired pattern that forms leadframe 100. The stamping process, on the other hand, uses a series of progressive dies to cut out portions of the metal sheet to create leadframe 100.

As mentioned above, there is a trend in the industry toward decreasing the size of semiconductor packages, and accordingly decreasing the size of leadframes. One way to decrease the size of leadframes is by reducing the number of bond fingers located proximate to the die pad. The number of bond fingers used in the leadframe, however, is dependent upon the number of electrical connections required by the semiconductor chip that is mounted to the leadframe.

The present invention reduces the number of bond fingers located proximate to the die pad by providing bond fingers that can accommodate more than one electrical connection. This allows the number of bond fingers proximate to the die pad to be reduced, while still providing the semiconductor chip with an adequate number of electrical connections.

Figure 2:
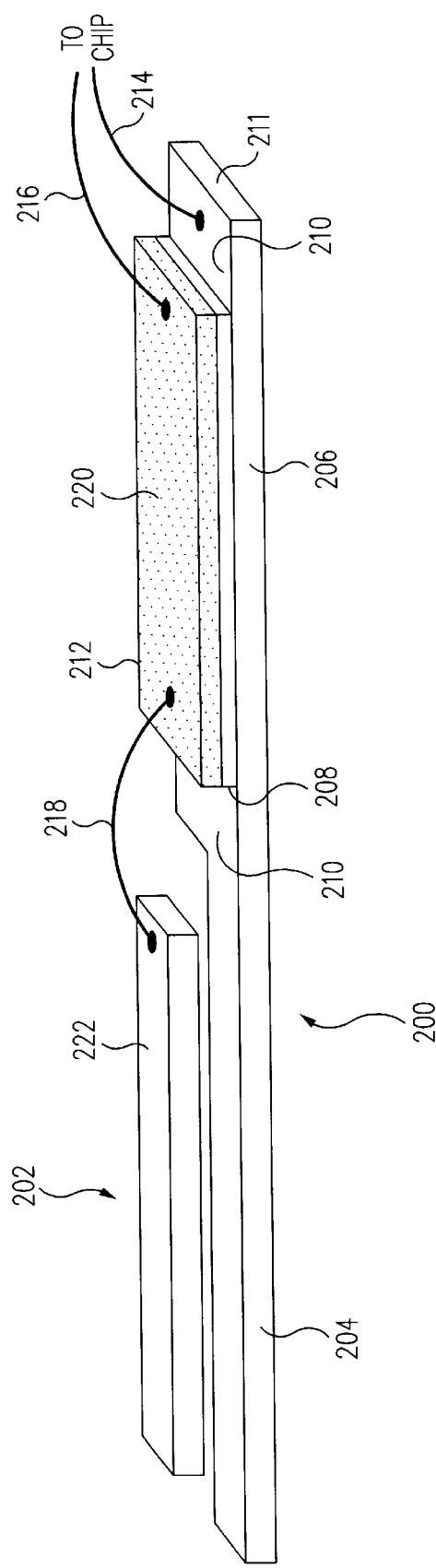
FIG. 2 is a perspective view of leads and a conductive element constructed according to an embodiment of the invention.

Turning to FIG. 2, a pair of leads for a leadframe are shown in accordance with one embodiment of the invention. One embodiment of a leadframe includes a plurality of alternating pairs of the leads. In this embodiment, the two leads comprise a long lead 200 that has a narrow outer portion 204 and a wider inner end segment 206. An adjacent short lead 202 has a narrow portion and no wide portion. The use of a wide inner end segment on lead 200 can serve a number of uses, such as providing a large surface area to allow for the space taken up by the bond wire or other chip coupling means, as well as allowing for tolerances in the bonding system. This is helpful because it is the wide inner end segments 206 of leads 200 that are located proximate to the die pad of a leadframe for coupling to a semiconductor chip when leads 200 and 202 are in a leadframe, such as leadframe 100. In this embodiment, leads 202 do not extend as far toward the die pad as leads 200, but rather terminate outward of the wide inner end segment 206 of the adjacent lead 200.

Figure 3:
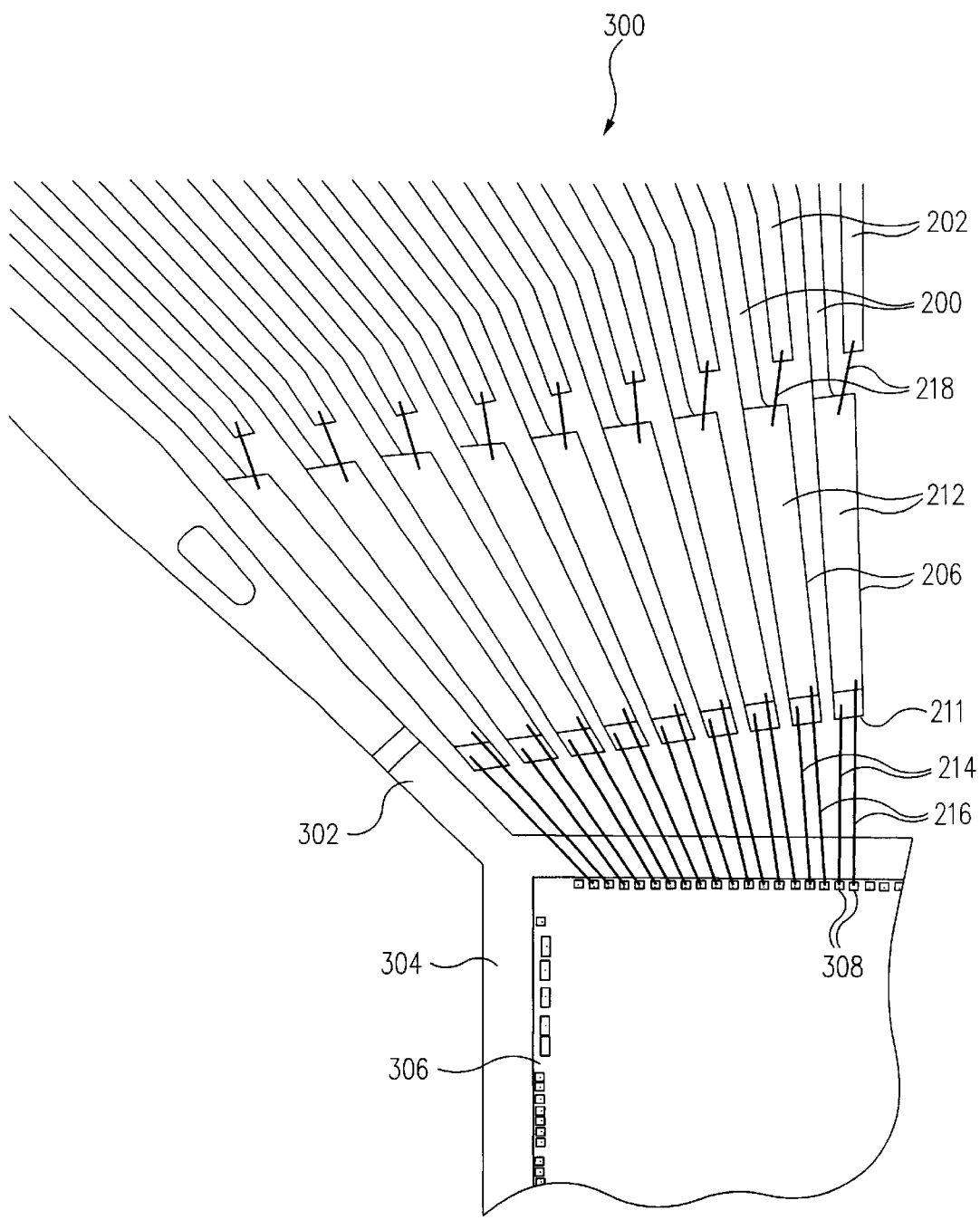
FIG. 3 is a plan view of a leadframe utilizing leads and conductive elements configured as shown in FIG. 2.

In a leadframe, leads 200 fan out as they extend from a die pad to a dam bar (this is shown in FIG. 3). As leads 200 fan out, gaps of progressively increasing width develop between the narrow bodies 204 of adjacent leads 200. It is in these gaps that leads 202 are placed. The length of leads 200 and 202 is thus determined by a number of factors, such as the lead width and spacing of the leadframe manufacturing process. The placement of short leads 202 into the spaces between longer leads 200 serves to either increase the number of leads in the package, minimize the size of the overall package by reducing the number of leads 200 required, or both.

As shown in FIG. 2, a rectangular nonconductive layer 208 is on a surface 210 of inner end segment 206 set back from an inner end 211 of lead 200. Nonconductive layer 208 can comprise any of a number of nonconductive materials including, but not limited to, a dielectric material such as a photo-imageable polyimide. On nonconductive layer 208 is a conductive layer 212. Conductive layer 212 can comprise any of a number of conductive materials including, but not limited to, a plated metal layer such as copper.

Nonconductive layer 208 is set back from inner end 211 to expose an inner portion of surface 210 of inner end segment 206 of lead 200. An electrical connection may be made to this exposed inner surface of lead 200, thereby allowing an electrical connection to be mounted to inner end segment 206. For instance, as shown in FIG. 2, a bond wire 214 can be bonded between a semiconductor chip and inner end segment 206 on the exposed portion of surface 210 between inner end 211 and nonconductive layer 208. This exposed surface 210 thus accommodates a first electrical connection on inner end segment 206 of lead 200.

A second electrical connection on inner end segment 206 is accommodated by conductive layer 212. Conductive layer 212 is electrically isolated from inner end segment 206 by nonconductive layer 208, and a second bond wire 216 can be provided to electrically couple the semiconductor chip to a surface 220 of conductive layer 212. Therefore, as shown in FIG. 2, a single inner end segment 206 can accommodate two independent, electrically isolated electrical connections, with the first coupled to surface 210 and the second coupled to conductive layer 212. It should be noted here that conductive couplings other than bond wires can be used to provide these electrical connections to inner end segment 200 and conductive layer 212.

Lead 202, being distal from the semiconductor chip, is indirectly coupled to the semiconductor chip through conductive layer 212, which, as mentioned, is electrically coupled to the semiconductor chip via bond wire 216. In the embodiment of FIG. 2, a bond wire 218 is used to electrically couple a surface 222 of lead 202 to surface 220 of conductive layer 212. Again, other forms of electrical connections can be used here as well. Therefore, both lead 200 and lead 202 are electrically coupled to the semiconductor chip, even though only lead 200 extends to a point proximate to the chip.

Accordingly, the input/output density of a leadframe utilizing leads 200 and 202 is double that of conventional leadframes without increasing the footprint of the complete package. Inner end segments 206 can accommodate double the number of electrical connections to the semiconductor chip, and the additional leads necessary for the increased input/output connections are placed into the otherwise unused gaps between the narrow body portions of leads 200.

FIG. 3 is a plan view of a leadframe 300 utilizing alternating pairs of leads 200 and 202, according to the embodiment described above with reference to FIG. 2. FIG. 3 shows leadframe 300 having a tie bar 302 and a die pad 304. A semiconductor chip 306 is located on die pad 304. A plurality of bond pads 308 located along the peripheral edge of the active surface of semiconductor chip 306 provide locations where electrical connections can be made to couple semiconductor chip 306 to leads 200 and 202.

The fan out of leads 200 can be seen as leads 200 extend outward from die pad 304 to the outer edge of leadframe 300. Just outward of inner end segments 206 of leads 200, leads 202 are positioned in the gaps between leads 200. The relatively large distance between the inner end of the leads 202 and semiconductor chip 306 is clearly shown here. Conductive layers 212 provide an intermediate conductive surface for coupling leads 202 to semiconductor chip 306.

Bond wires 214 and 216 couple semiconductor chip 306 to inner end segments 206 and conductive layers 212 respectively. Bond wires 218 couple conductive layers 212 to leads 202. Thus, leads 200 and 202 are in electrical contact with semiconductor chip 306 and can carry independent electrical signals to and from chip 306.

Figure 4:
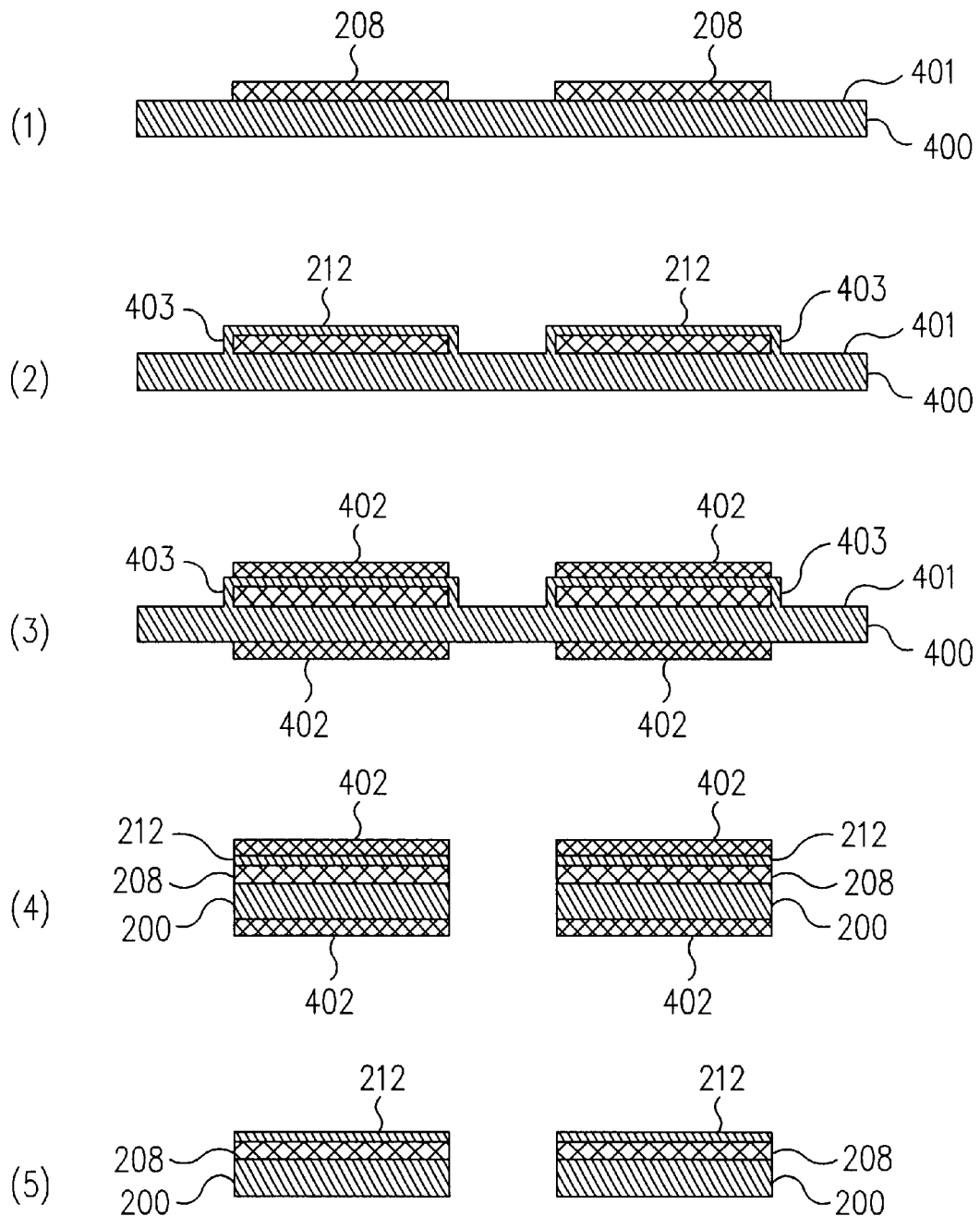
FIG. 4 illustrates a method of forming the leads and conductive elements of FIG. 2 according to an embodiment of the invention.

FIG. 4 is a cross-sectional view of a method of making inner end segments 206 of leads 200 of a leadframe 300, with conductive layers 212 and nonconductive layers 208. The method begins with a metal sheet 400 from which leadframe 300 will be formed. At step (1), nonconductive layers 208, such as dielectric material layers, are applied to a surface 401 of metal sheet 400. Typically this is done by first applying a layer of the dielectric over the entire metal sheet 400 and then patterning the dielectric material to form the desired layers 208, using, for instance, a photo-imageable dielectric material such as polyimide.

At step (2), a conductive layer 212 is applied on each of nonconductive layers 208 (depending on the final circuit pattern, there can be one or more nonconductive layers 208). This can be done, for instance, by plating a metal such as copper on top of nonconductive layers 208. The use of a plating process allows the copper to be placed directly atop nonconductive layers 208 and allows for a desired thickness to be reached. Note that conductive layer 212 covers the top of nonconductive layer 208, and a portion 403 of conductive layer 212 covers the orthogonal sides of nonconductive layer 208.

At step (3), an etch resist mask 402 is applied onto the conductive layers 212 and potentially other portions of metal sheet 400. Etch resist mask 402 is typically patterned onto metal sheet 400 and conductive layers 212, and mask 402 is patterned in a manner that will allow leadframe 300 to be formed from metal sheet 400. For instance, mask 402 will define leads 200, leads 202, die pad 304, tie bars 302, and the dam bar (not shown) of leadframe 300.

At step (4) an etchant is applied and the structure is etched to form leadframe 300. The etch step forms the various features of leadframe 300 mentioned above, including leads 200, leads 202, die pad 304, tie bars 302, and so forth (FIG. 4 only shows leads 200 from the inner ends 211 of alternating leads 200). Step (4) also removes the portion 403 of conductive layer 212 that extends up the orthogonal sides of nonconductive layer 208, thereby electrically isolating conductive layer 212 from lead 200. Finally, at step (5), mask 402 is removed, leaving behind leads 200 that include nonconductive layers 208 and conductive layers 212.

In an additional step, a layer of silver, gold, palladium, nickel, or the like can be plated to surfaces 210 of leads 200, surfaces 222 of leads 202, and surfaces 220 of conductive layers 212 to aid in a later process of electrically connecting (e.g., by bond wire attachment) semiconductor chip 306 to leads 200 and 202 and conductive layers 212.

Figure 5:
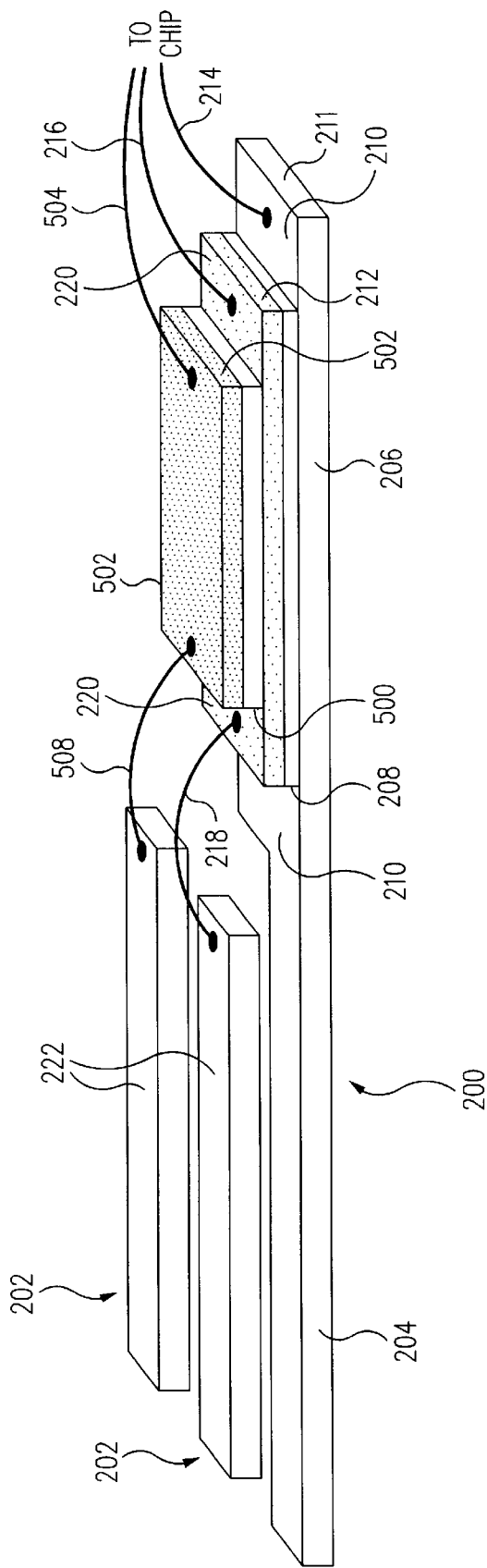
FIG. 5 is a perspective view of leads and conductive elements constructed according to another embodiment of the invention.

FIG. 5 is an alternative embodiment of the invention. Here, a group of three leads is shown: one long lead 200 and two side-by-side leads 202 adjacent to lead 200. The inner end of leads 202 are outward of wide inner end segment 206 of lead 200. Alternatively, lead 200 may be between the two leads 202. A plurality of conductive and nonconductive layers are provided on inner end segment 206 of lead 200 in an interleaved fashion. As shown in FIG. 5, inner end segment 206 has a first nonconductive layer 208 located on its surface 210 and set back from inner end 211. On top of nonconductive layer 208 is a first conductive layer 212. Conductive layer 212 is electrically coupled to the middle lead 202 via bond wire 218, and is electrically coupled to semiconductor chip 306 via bond wire 216.

A second nonconductive layer 500 is located on conductive layer 212. Second nonconductive layer 500 is set back from both the inner end of first conductive layer 212, where bond wire 216 connects to conductive layer 212, and also is set back from the outer end of conductive layer 212, where bond wire 218 connects to conductive layer 212. On nonconductive layer 500 is a second conductive layer 502. Conductive layer 502 can be electrically coupled to semiconductor chip 306 by a bond wire 504, and to the outer lead 202 by a bond wire 508. In other embodiments, further nonconductive layers and conductive layers can be mounted atop conductive layer 502 to provide further electrical paths.

Accordingly, by using multiple conductive and nonconductive layers on inner end segment 206 of lead 200, more bond wires can be accommodated by lead 200 for ultimate electrical connection via the interleaved conductive layers to plural leads 202. A leadframe constructed in the manner of FIG. 5 would have alternating sets of three leads: one lead 200 and two adjacent leads 202. The leadframe would have much increased density compared to a conventional leadframe.

Figure 6A:
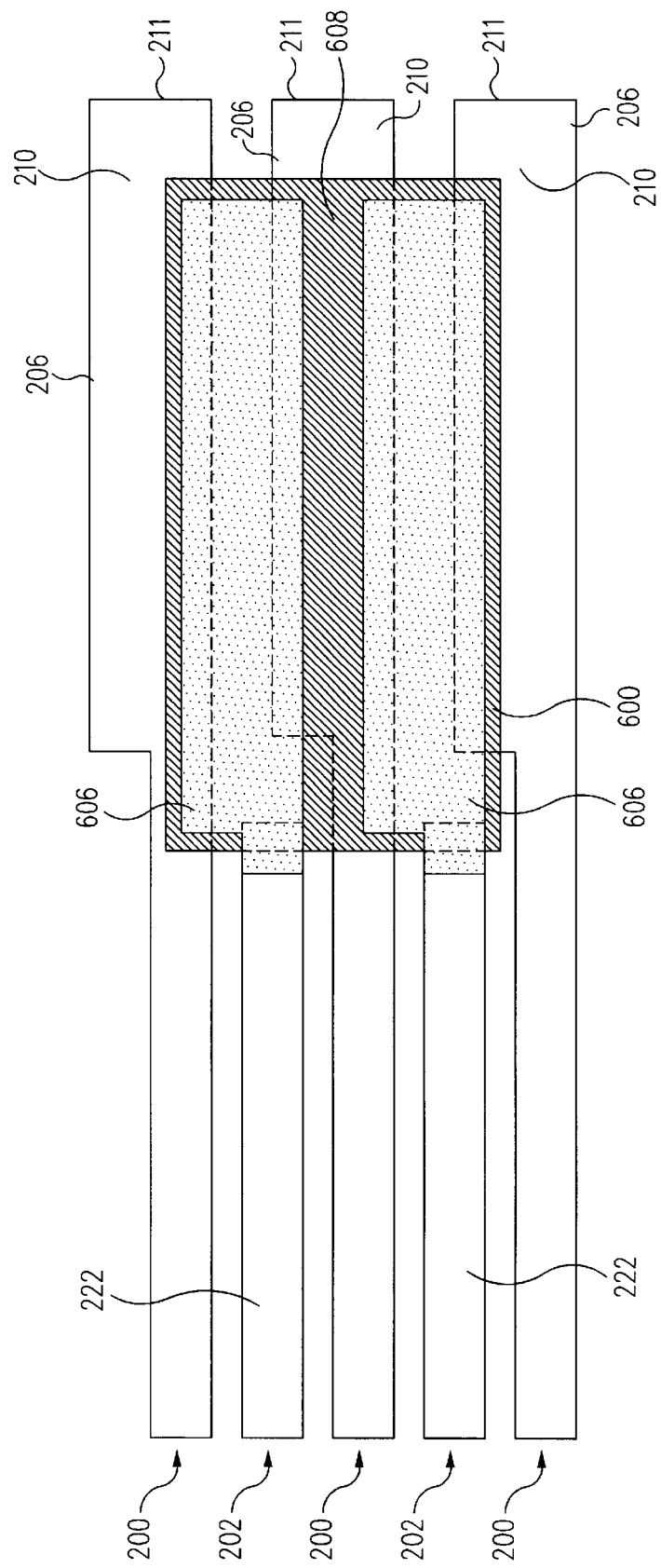
FIGS. 6A to 6C are exploded views of leads and conductive elements according to yet another embodiment of the invention.
Figure 6B:
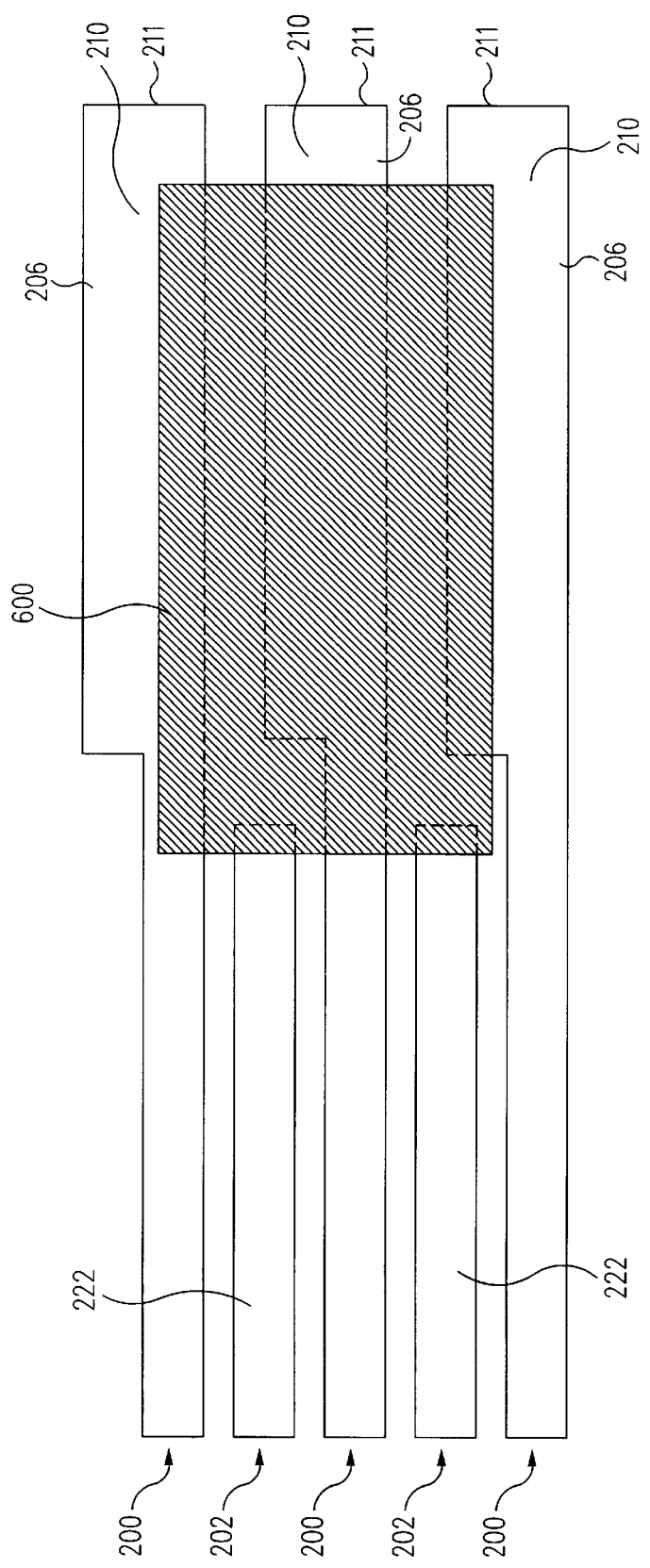
Figure 6C:
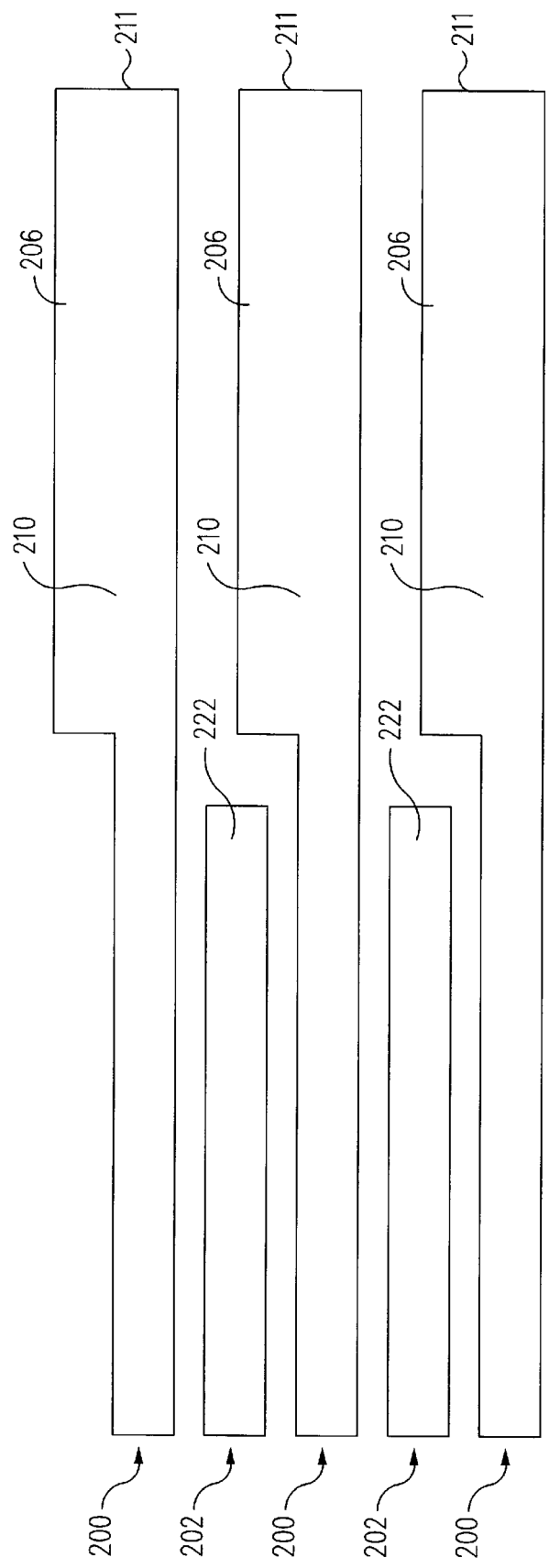

FIGS. 6A to 6C are a non-exploded view and two exploded views of leads and conductive elements of a leadframe according to yet another embodiment of the invention. FIG. 6A shows a plurality of alternating pairs of leads 200 and 202 that are overlaid with a nonconductive layer 608, which in turn is overlaid with plural conductive layers 606. This configuration may be better understood by first viewing FIG. 6C, which shows the underlying pairs of leads 200 and 202, and then viewing FIG. 6B, which shows nonconductive layer 608 spanning plural pairs of leads 200 and 202.

Returning to FIG. 6C, a nonconductive layer 600 is on surfaces 210 of a plurality of leads 200, and can be provided on inner end portions of surfaces 222 of a plurality of leads 202 as well. Nonconductive layer 600 spans the empty space between inner end segments 206 of adjacent leads 200. Nonconductive layer 600 has a surface 608 opposite surface 210 of inner end segments 206 of leads 200. One or more conductive layers 606 are on surface 608. Each conductive layer 606 is electrically isolated from the other conductive layers 606 also located on nonconductive layer 600, in addition to being electrically isolated from leads 200 by nonconductive layer 600. As described above, conductive layers 606 can be formed by many methods, including plating individual metal layers atop nonconductive layer 600, or plating or applying a continuous metal sheet onto nonconductive layer 600 and then etching out individual conductive layers 606.

Conductive layers 606 can be located anywhere on nonconductive layer 600 and can be formed in any of a variety of configurations. Unlike conductive layer 212 shown in FIG. 2 above, conductive layers 606 are not constrained to being located directly above leads 200 and do not have to be the same width as inner end segments 206 of leads 200. This is possible because nonconductive layer 600 is a single, continuous layer that electrically isolates all conductive layers 606 from leads 200. In the embodiment of FIG. 6A, conductive layers 606 are mounted such that they traverse two leads 200 simultaneously. In other embodiments, conductive layers 606 can cross multiple leads 200. This allows for a variety of staggered lead arrangements and interconnection between the two layers using the plating process, as well as allowing for routing crossed signal paths.

Each conductive layer 606 is electrically coupled to a lead 202 adjacent to the lead 200. In FIG. 6A, two conductive layers 606 are shown and they are each electrically coupled to one of the leads 202 via a plated metal layer that extends from conductive layer 606 over an orthogonal sidewall of nonconductive layer 600 down to the lead 202. In other embodiments, bond wires can be used to electrically couple the conductive layer 606 to the lead 202.

In FIG. 6A, each conductive layer 606 forms an extension of the lead 202 to which is electrically connected. Again, nonconductive layer 600 electrically isolates the lead 202 from the inner end segment 206 of the adjacent leads 200. Thus, where the inner end of leads 202 previously could not extend close to semiconductor chip 306 because of a lack of space proximate to die pad 304, leads 202 can now be electrically coupled to conductive layers 606 that act as virtual inner end segments and that are configured in a staggered arrangement with inner end segments 206 of leads 200. The use of a staggered arrangement also creates more space for bond wires when leads 200 and 202 are coupled to a semiconductor chip 306.

FIGS. 7A and 7B are side views of the leadframe embodiment of FIG. 6A. In FIG. 7A, nonconductive layer 600 is shown atop lead 200 on surface 210. On top of nonconductive layer 600 is conductive layer 606. In FIG. 7B, the adjacent lead 202 of the pair of leads 200 and 202 is shown with nonconductive layer 600 on a relatively small portion of surface 222 at the inner end of lead 202. Conductive layer 606 is on top of nonconductive layer 600, and a plated metal orthogonal layer 702 is present that extends off conductive layer 606 and down the orthogonal inner sidewall of nonconductive layer 600 and into a bonded joint with surface 222 of lead 202 to provide an electrical coupling between conductive layer 606 and lead 202. Again, a bond wire or other means can be used instead of orthogonal layer 702 to electrically couple conductive layer 606 to lead 202 in other embodiments.

Figure 8:
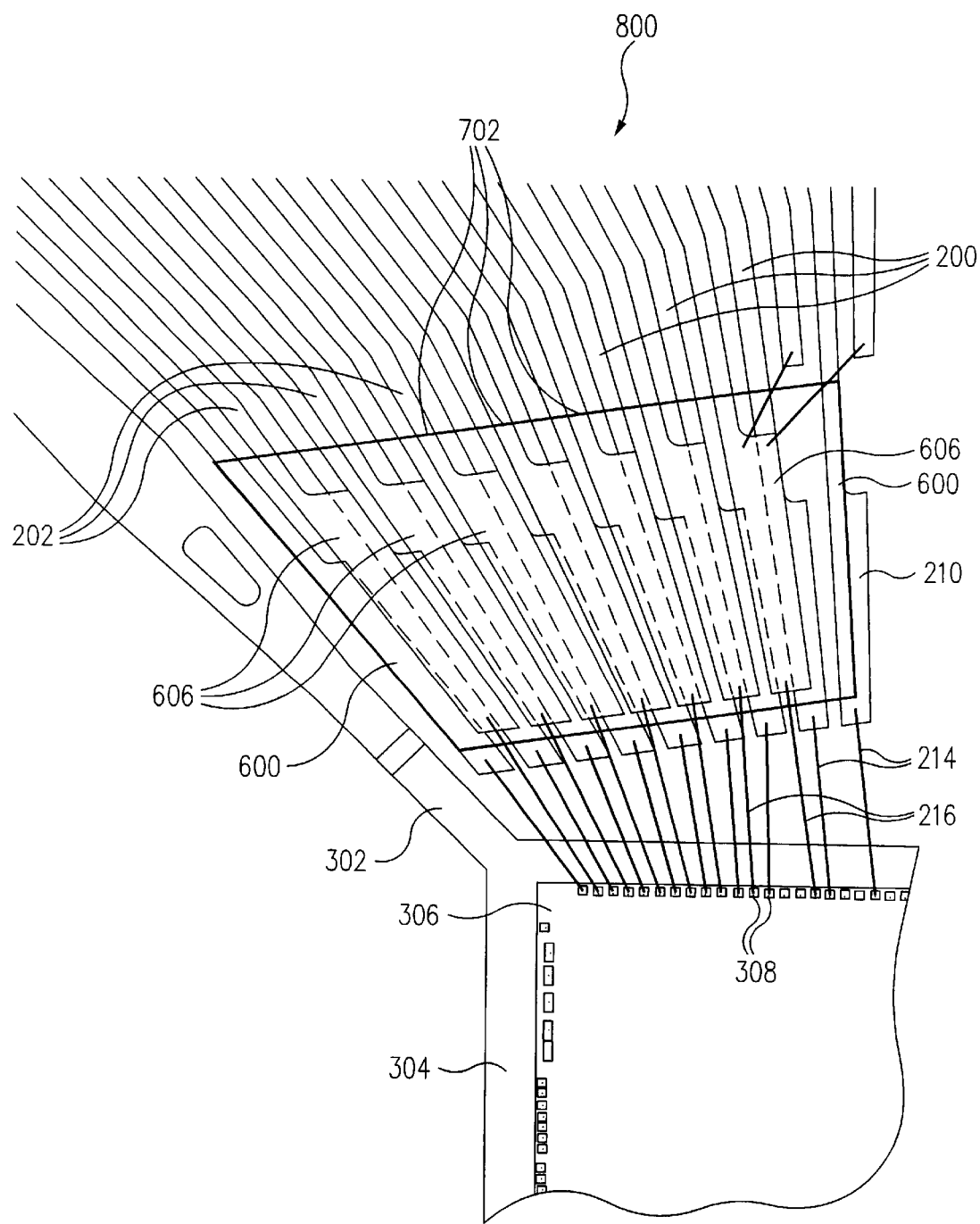
FIG. 8 is a plan view of a leadframe utilizing leads and conductive elements configured as shown in FIG. 6A.

FIG. 8 is a plan view of a leadframe 800 utilizing leads and conductive elements configured according to the embodiment illustrated in FIGS. 6A–C and 7A–B. Pairs of leads 200 and 202 are shown fanning out from an inner end proximate to a die pad 304 to the outer portions of leadframe 800. A single nonconductive layer 600 is located on surface 210 of the adjacent leads 200, as well as on inner end portions of surfaces 222 of leads 202. Although in FIG. 8 only nine leads 200 are shown, nonconductive layer 600 can be located on any number of leads 202. Nonconductive layer 606 may cover tie bar 302 as well as leads 200 and 202. For instance, a single nonconductive layer 606 may be provided in the form of a ring fully around die pad 304. Alternatively, four nonconductive layers 606 may be provided, one covering each set of leads that extend to each of the four sides of a rectangular die pad 304.

A plurality of conductive layers 606 are provided on surface 608 of nonconductive layer 600 of FIG. 8. As explained above, conductive layers 606 can be formed using a number of methods, including metal plating or etching techniques. Each conductive layer 606 is electrically isolated from the other conductive layers 606 on nonconductive layer 600. In FIG. 8 there are seven such conductive layers 606. In other embodiments any number of conductive layers 606 are possible. Conductive layers 606 are electrically coupled to leads 202 by a plated metal layer 702, described above in reference to FIG. 7B. As seen in FIG. 8, conductive layers 606 form a row of virtual inner end segments for leads 202 located atop inner end segments 206 of leads 200. Each conductive layer 606 functions as a conductive bridge between a bond wire 216 connected to chip 306 and a lead 202. A plurality of bond wires 214 are used to couple leads 200 to a plurality of bond pads 308 on semiconductor chip 306. Bond wires 216, on the other hand, electrically couple semiconductor chip 306 to respective conductive layers 606. The use of conductive layers 606 to form a second row of virtual inner end segments atop inner end segments 206 of leads 200 can approximately double the input/output capacity of leadframe 800.

Figure 9:
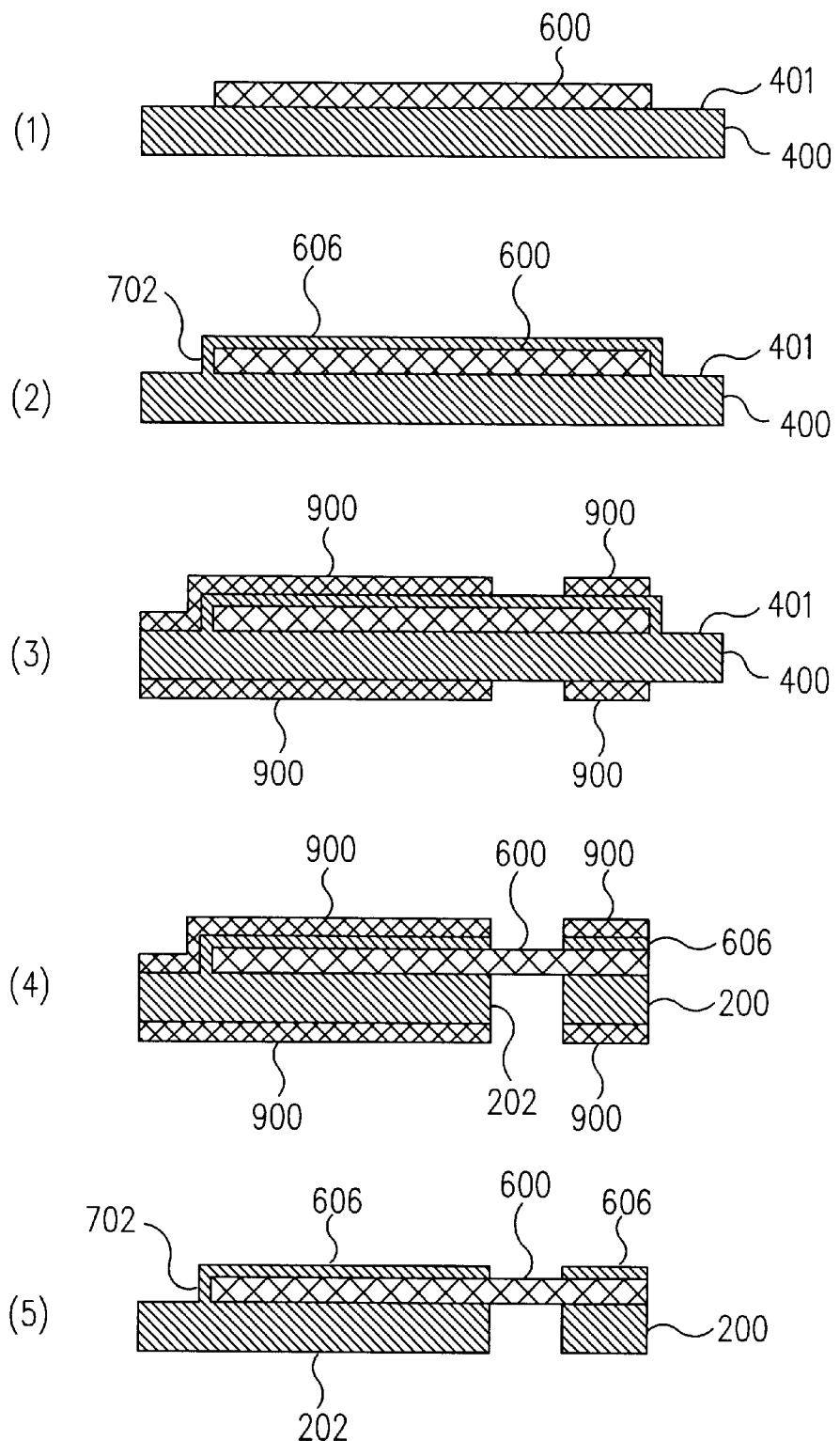
FIG. 9 illustrates a method of forming the leads and conductive elements of FIG. 6A according to another embodiment of the invention.

FIG. 9 demonstrates a method of forming conductive layers 606 and a nonconductive layer 600 on leads 200 and 202 of a leadframe 800. The method begins with a metal sheet 400 from which leadframe 800 will be formed. At step (1), nonconductive layer 600, formed from a nonconductive material such as a dielectric material, is applied to a selected subportion of surface 401 of metal sheet 400. The dielectric material can be any of a variety of materials, including photo-imageable or standard polyimide. Unlike the method described with reference to FIG. 4, here nonconductive layer 600 spans an area that ultimately will form a plurality of leads 200.

Next at step (2), a continuous conductive layer 606 is applied on nonconductive layer 600. Again, this can be done by plating a metal on top of nonconductive layer 600, or by applying a second metal sheet on top of nonconductive layer 600. Note that a plated metal orthogonal layer 702 of conductive layer 606 extends over the orthogonal sides of nonconductive layer 606 to bond with surface 401 of sheet 400. At step (3), an etch resist mask 900 is applied onto the conductive layer 606 and portions of metal sheet 400. Mask 900 is patterned in a manner that will allow leadframe 800 to be formed from metal sheet 400. For instance, mask 900 will define leads 200, leads 202, conductive layers 606, die pad 304, tie bars 302, and the dam bar (not shown) of leadframe 800. Etch resist mask 900 is typically patterned onto metal sheet 400 and conductive layer 606.

At step (4) an etchant is applied and the structure is etched to form leadframe 800. The etch step forms the various features of leadframe 800 mentioned above, including leads 200, leads 202, conductive layers 606, and so forth. Finally, at step (5), mask 900 is removed, leaving behind leads 200 and 202 that include nonconductive layer 600 and conductive layers 606.

In an alternative embodiment of the invention, leadframe 800 can be manufactured by initially forming just leads 200 and 202 from metal sheet 400. Then a preformed combination of nonconductive layer 600 and conductive layers 606 can be mounted upon leads 200 and 202. In one embodiment for instance, pre-patterned copper lead segments already mounted on polyimide tape can be placed atop leads 200 and 202. The polyimide tape can have an adhesive bottom surface so that it adheres to leads 200 and 202. Then the pre-patterned copper lead segments can be electrically coupled to leads 200 or 202 via wire bonds or other forms of electrical couplings.

In this alternative embodiment, the pre-patterned copper lead segments and polyimide tape combination can be formed by a variety of processes. In one such process, the pre-patterned copper lead segments can be plated onto the polyimide tape. In another process, the pre-patterned copper lead segments can be etched out of a metal layer that has been mounted or plated atop the polyimide tape.

As mentioned above with reference to FIG. 4, in an additional step a layer of silver, gold, palladium, nickel, or the like can be plated to leads 200 and conductive layers 606 to aid in a later process of electrically connecting (e.g., by bond wire attachment) semiconductor chip 306 to leads 200 and conductive layers 606.

Figure 10:
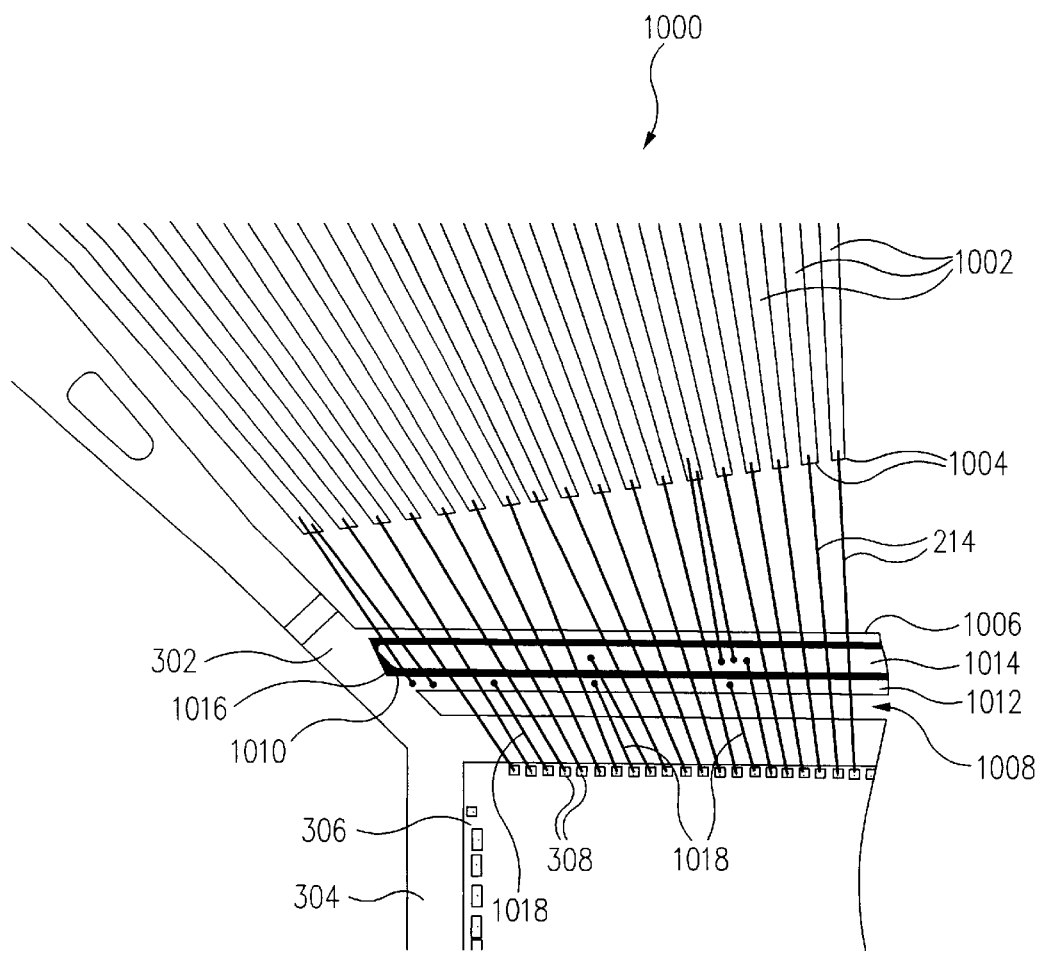
FIG. 10 is a plan view of a leadframe that includes a metal strip structure and a conductive strip structure according to another embodiment of the invention.

FIG. 10 is a plan view of a leadframe 1000 constructed according to yet another embodiment of the invention. Leadframe 1000 includes a plurality of leads 1002 that extend from an outer dam bar (not shown) to an inner end 1004 adjacent to a die pad 304. In this case, leads 1002 are conventional, and gradually narrow in width going toward die pad 304. While FIG. 10 only shows one tie bar 302 and only part of die pad 304, leadframe 1000 may have four tie bars 302 that each extend from an outer dam bar to an integral connection with one of four corners of a rectangular die pad 304. Leads 1002 extend toward each of the four sides of die pad 304, as in a quad package. Extending between adjacent tie bars 302 transverse to leads 1002 is a metal strip 1006. One or more metal strips 1006 may be provided, with one metal strip 1006 adjacent to all four or less than the four sides of die pad 304. Metal strip 1006 can be formed during the same etching or stamping process that forms leads 1002 and die pad 304. In other embodiments, metal strip 1006 can be formed as an extension of die pad 304 such that there is no free space 1008 between metal strip 1006 and die pad 304.

A nonconductive layer 1010 is provided on a surface 1012 of metal strip 1006. As above, this nonconductive layer 1010 can be formed from a dielectric material such as polyimide. The edges of nonconductive layer 1010 are set back from the edges of metal strip 1006, thereby exposing portions of surface 1012 of metal strip 1006 that allow for bond wires or other conductors to be electrically connected between metal strip 1006 and particular leads 1002, and between metal strip 1006 and semiconductor chip 306.

A conductive strip 1014 is provided on a surface 1016 of nonconductive layer 1010. As with conductive layers 212 and 606 above, conductive strip 1014 can be formed by a number of methods, including plating a metal layer onto nonconductive layer 1010. Conductive strip 1014 is electrically isolated from metal strip 1006 by nonconductive layer 1010, and therefore provides a second, independent electrical path that can be coupled to leads 1002 and/or semiconductor chip 306.

Providing both metal strip 1006 and conductive strip 1014 provides two independent electrical paths that can be utilized by both leads 1002 and semiconductor chip 306. These electrical paths can be used for any of a variety of purposes. For instance, when a package containing leadframe 1000 is mounted on a printed circuit board, a first reference voltage, e.g., $V_{DD}$ or $V_{SS}$, may be provided on one or more leads 1002, and may be conducted to metal strip 1006 by a bond wire 214 that extends between the lead 1002 and metal strip 1006. Thereafter, any of the bond pads 308 of the chip 306 adjacent to metal strip 1002 may be coupled by a bond wire 1018 to metal strip 1006, and thereby may receive the reference voltage. A second reference voltage, e.g., ground voltage, may be provided to conductive strip 1014 by a bond wire 214 coupled between a lead 1002 and conductive strip 1014. Thereafter, any of the bond pads 308 of chip 306 may be coupled by a bond wire 1018 to conductive strip 1014, and thereby may receive the ground voltage. In sum, metal strip 1006 and conductive strip 1014 allow a plurality of reference voltages, over even input/output signals, to be provided to a plurality of bond pads 308, even bond pads 308 that are distal from the lead 1002 that originally carried the reference voltage or input/output signal.

In alternative embodiments to the structure shown in FIG. 10, multiple conductive strips 1010 can be provided on metal strip 1002 to provide multiple electrical paths. The multiple conductive paths 1010 can be provided side-by-side on a wide metal strip 1002, or the multiple conductive strips 1010 can be provided in a stacked arrangement with an interleaved dielectric layer similar to what is shown in FIG. 5.

Figure 11:
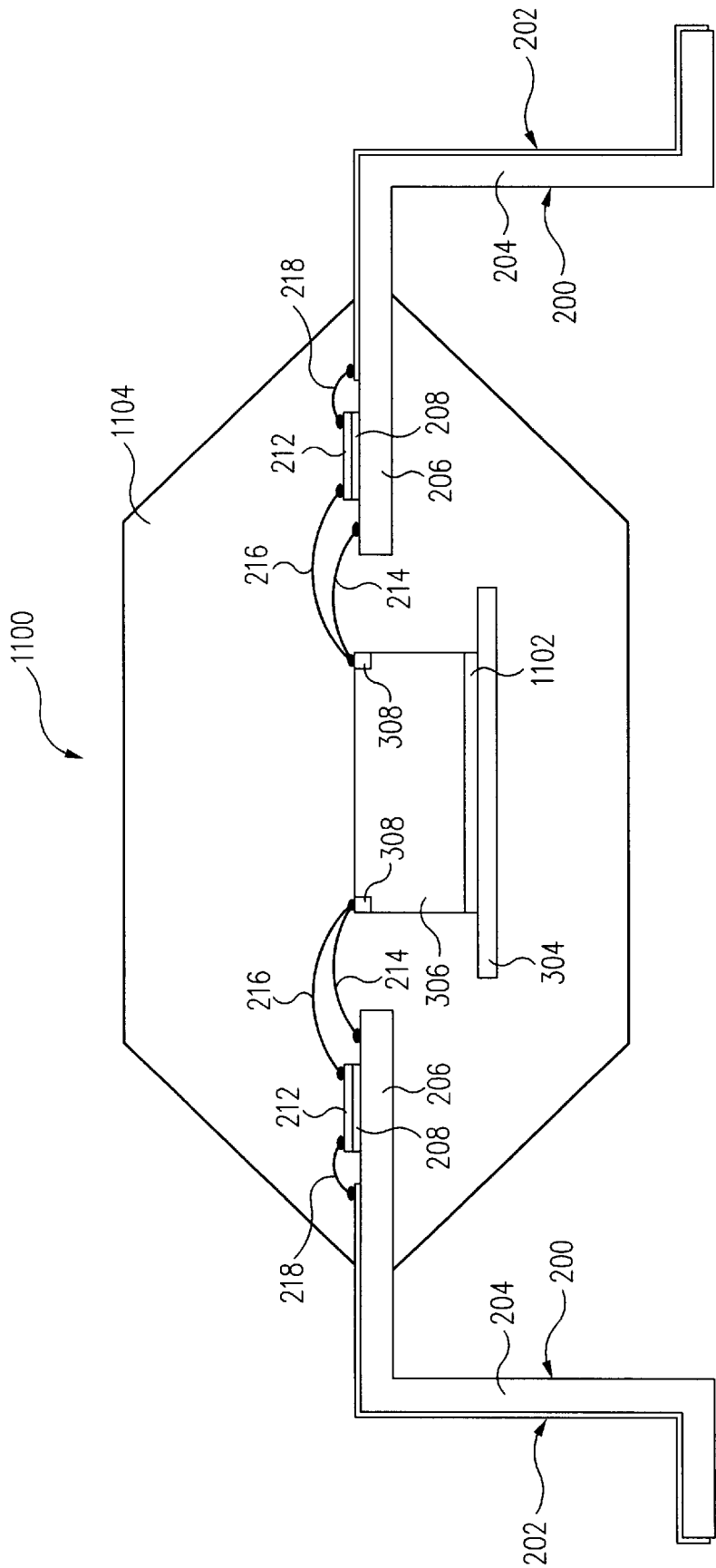
FIG. 11 is a cross-sectional side view of a semiconductor package according to an embodiment of the invention.

FIG. 11 is a sectional diagram of an exemplary semiconductor package 1100 that includes leadframe 300 of FIG. 3. Practitioners will appreciate that a wide variety of leadframes can be made in view of the teachings herein, and that a wide variety of packages can be made with such leadframes. Accordingly, package 1100 is just an example.

Semiconductor package 1100 includes semiconductor chip 306 mounted on die pad 304 using an adhesive layer 1102. Die pad 304 is downset from leads 200 and 202. Semiconductor chip 306 has a plurality of bond pads 308 that are electrically coupled to inner end segments 206 of leads 200 via a plurality of bond wires 214. Other bond pads 308 of semiconductor chip 306 are electrically coupled by bond wires 216 to conductive layers 212, which in turn are electrically coupled by bond wires 218 to leads 202. Conductive layers 212 are electrically isolated from leads 200 by nonconductive layers 208, but are electrically coupled to leads 202 by bond wires 218. In other embodiments, this electrical coupling can be facilitated by conductors other than bond wires 214 and 216.

Semiconductor package 1100 also includes an insulation encapsulant 1104 that fills in and around die pad 304, chip 306, bond wires 214, 216, and 218, inner end segments 206, conductive layers 212, nonconductive layers 208, and portions of the outer portions of leads 200 and 202. Encapsulant 1104 is typically a nonconductive polymer (e.g., an epoxy-based resin) that is injection or transfer molded over leadframe 300 within the dam bar (not shown) of leadframe 300, and then cured. The dam bar is removed to electrically isolate the leads 200 and 202 from each other. Typically, individual packages are singulated from a strip of leadframes that are processed as a group. The laterally extending outer, unencapsulated portions (if any) of leads 200 and 202 may be bent into a variety of configurations, such as gull wing or J-lead configurations during a trim and form operation.

Figure 12:
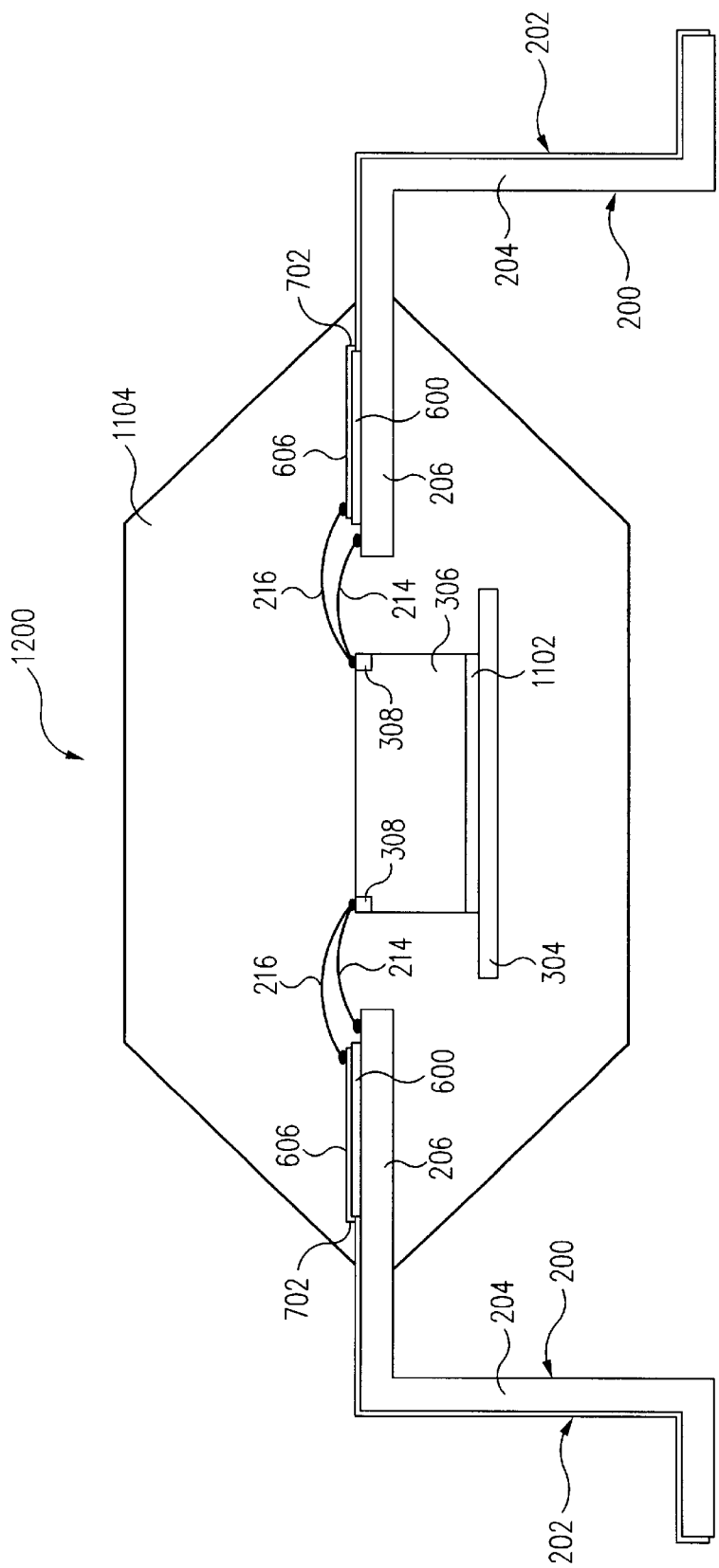
FIG. 12 is a cross-sectional side view of a semiconductor package according to another embodiment of the invention.

FIG. 12 is a sectional diagram of an exemplary semiconductor package 1200 that includes leadframe 800 of FIG. 8.

Again, practitioners will appreciate that a wide variety of leadframes can be made in view of the teachings herein, and that a wide variety of packages can be made with such leadframes. Accordingly, package 1200 is just an example.

Semiconductor package 1200 includes semiconductor chip 306 mounted on die pad 304 using an adhesive layer 1202. Semiconductor chip 306 has a plurality of bond pads 308 that are electrically coupled to inner end segments 206 of leads 200 via a plurality of bond wires 214. Other bond pads 308 are electrically coupled by a bond wire 216 to a respective conductive layer 606, which in turn has an orthogonal portion 702 that is fused to a lead 202.

In the semiconductor package 1200, leads 200 with inner end segment 206, and leads 202 with conductive layers 606, may be formed according to the process described above with reference to FIGS. 6 to 9, among other possibilities. Therefore, each conductive layer 606 is electrically isolated from leads 200 by continuous underlying nonconductive layer 600, but is electrically coupled to one of leads 202 by a plated metal layer 702 which extends off each conductive layer 606 and orthogonally down onto its respective lead 202.

Semiconductor package 1200 also includes an insulation encapsulant 1104 that fills in and around die pad 304, chip 306, bond wires 214 and 216, inner end segments 206, conductive layers 606, nonconductive layer 600, and portions of the outer portions of leads 200 and 202. And as above, the dam bar (not shown) of leadframe 800 is removed to electrically isolate the leads from each other.

Leadframe 1000 of FIG. 10 may be provided in packages similar to packages 1100 and 1200 of FIGS. 11 and 12.

Unlike previously developed metal patterning techniques, in which a substantial amount of unused space was left between leads as the leads fan out toward the outer edges of a leadframe, embodiments of the present invention provide plural sets of leads, including one long lead that extends close to the die pad and at least one adjacent short lead. The long leads include at least one conductive layer that is electrically isolated from the long lead, and serves as a conductive bridge to carry an electrical signal to and from the shorter lead. The resulting leadframe requires less inner end segments proximate to the die pad and allows for the creation of smaller leadframes. In other embodiments, the concept of a conductive layer that is electrically isolated from an underlying support structure is used to provide a reference voltage to a plurality of dispersed bond pads of the chip. Again, a more functional and/or smaller leadframe is achieved.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A leadframe comprising:
    a plurality of metal leads, each lead including an inner end segment beginning at an inner end of the lead;
    a nonconductive layer on the inner end segment of at least one of the leads; and
    an electrically conductive layer on a surface of the nonconductive layer and generally parallel to a longitudinal direction of the inner end segment, wherein the nonconductive layer electrically isolates the electrically conductive layer from the respective lead upon which the nonconductive layer is positioned;
    wherein the inner end segment of each of a first subset of the leads extends further toward a center of the lead frame than the inner end segment of each of a second subset of the leads; and
    wherein a width of the inner end segment of the first subset of the leads is greater than a width of the inner end segments of the second subset of the leads.

2. The leadframe of claim 1, wherein the nonconductive layer is set back from the inner end of the lead.

3. The leadframe of claim 1, wherein the nonconductive layer spans the inner end segment of at least two of the leads.

4. The leadframe of claim 3, wherein a plurality of the electrically conductive layers are located on the surface of the nonconductive layer, said electrically conductive layers being electrically isolated from one another, and are generally parallel to a longitudinal direction of the inner end segments.

5. The leadframe of claim 1, wherein the electrically conductive layer is electrically coupled to another one of the plurality of leads.

6. The leadframe of claim 1, further comprising a plurality of the nonconductive layers and a plurality of the electrically conductive layers positioned on the inner end segment of at least one of the leads in an interleaved fashion.

7. The leadframe of claim 1, wherein the nonconductive layer is positioned on the inner end segment of one of the leads of the first subset.

8. The leadframe of claim 7, wherein the electrically conductive layer is electrically coupled to an adjacent one of the leads of the second subset.

9. The leadframe of claim 1, wherein the nonconductive layer spans the inner end segment of at least two of the leads of the first subset.

10. The leadframe of claim 9, wherein a plurality of the electrically conductive layers are on the surface of the nonconductive layer, said electrically conductive layers being isolated from one another, and each of the electrically conductive layers is proximate to a separate one of the leads of the second subset.

11. The leadframe of claim 10, wherein the plurality of the electrically conductive layers are electrically coupled to leads of the second subset.

12. A leadframe comprising:
    a plurality of metal leads, each lead including an inner end segment beginning at an inner end of the lead;
    a nonconductive layer on the inner end segment of at least one of the leads; and
    an electrically conductive layer on a surface of the nonconductive layer and generally parallel to a longitudinal direction of the inner end segment, wherein the nonconductive layer electrically isolates the electrically conductive layer from the respective lead upon which the nonconductive layer is positioned;
    wherein the inner end segment of each of a first subset of the leads extends further toward a center of the lead frame than the inner end segment of each of a second subset of the leads; and
    wherein leads of the first subset are each adjacent to at least one lead of the second subset, thereby forming plural sets of leads, each including one lead of the first subset and at least one lead of the second subset, wherein each lead of the first subset includes the nonconductive layer and the electrically conductive layer.

13. The leadframe of claim 12, wherein the electrically conductive layer is positioned entirely between opposing edges of the at least one of the leads.

14. A semiconductor package comprising:
a plurality of metal leads, each lead including an inner end segment beginning at an inner end of the lead;
a nonconductive layer on the inner end segment of at least a first one of the leads and set back from its inner end;
an electrically conductive layer on a surface of the nonconductive layer positioned entirely between opposite edges of the first lead, wherein the nonconductive layer electrically isolates the electrically conductive layer from the first lead upon which the electrically conductive layer is positioned; and
a semiconductor chip separately electrically coupled to the inner end segment and the electrically conductive layer of the first lead, wherein a second one of the leads also is electrically coupled to the electrically conductive layer.

15. The semiconductor package of claim 14, wherein the inner end segment of the first lead extends further toward a center of the package than the inner end segment of the second lead.

16. The semiconductor package of claim 14, wherein the second lead is electrically coupled to the electrically conductive layer via a bond wire.

17. The semiconductor package of claim 14, further comprising a plurality of the first leads and a plurality of the second leads, wherein the nonconductive layer spans the inner end segment of a plurality of the first leads, a plurality of isolated ones of the electrically conductive layers are on the nonconductive layer, and each of the electrically conductive layers is electrically coupled to a separate one of the second leads.

18. The semiconductor package of claim 14, further comprising a plurality of the second leads, and a plurality of the nonconductive layers and a plurality of the conductive layers, wherein the plural nonconductive and conductive layers are interleaved on the inner end segment of the first lead, and each of the plural electrically conductive layers is electrically coupled to a separate one of the second leads.

19. The semiconductor package of claim 14, further comprising a plurality of the first leads and a plurality of the second leads, with each first lead including at least one said nonconductive layer and at least one said electrically conductive layer, the electrically conductive layer being electrically coupled to both the semiconductor chip and the respective second lead.

20. The semiconductor package of claim 14, wherein the semiconductor chip is coupled to the inner end segment of the first lead via a bond wire.

21. The semiconductor package of claim 20, wherein the semiconductor chip is electrically coupled to the electrically conductive layer of the first lead via a bond wire.

22. The semiconductor package of claim 21, wherein the second lead is electrically coupled to the electrically conductive layer via a bond wire.

23. A semiconductor package comprising:
a plurality of metal leads, each lead including an inner end segment beginning at an inner end of the lead;
a nonconductive layer on the inner end segment of at least a first one of the leads and set back from its inner end;
an electrically conductive layer on a surface of the nonconductive layer, wherein the nonconductive layer electrically isolates the electrically conductive layer from each said first lead upon which the nonconductive layer is positioned; and
a semiconductor chip separately electrically coupled to the inner end segment and the electrically conductive layer of the first lead, wherein a second one of the leads also is electrically coupled to the electrically conductive layer;
wherein a width of the inner end segment of the first lead is greater than a width of the inner end segment of the second lead, the second lead is adjacent the first lead, and the inner end segment of the second lead terminates outward of the inner end segment of the first lead.

24. The semiconductor package of claim 23, wherein opposing edges of the electrically conductive layer are coplanar with respective opposing edges of the inner end segment of the first lead.

25. The semiconductor package of claim 23, wherein a longitudinal axis of the electrically conductive layer is parallel with a longitudinal axis of the inner end segment of the first lead.

26. The semiconductor package of claim 23, wherein the semiconductor chip is coupled to the inner end segment of the first lead via a bond wire.

27. The semiconductor package of claim 26, wherein the semiconductor chip is electrically coupled to the electrically conductive layer of the first lead via a bond wire.

28. The semiconductor package of claim 27, wherein the second lead is electrically coupled to the electrically conductive layer via a bond wire.

29. A semiconductor package comprising:
a plurality of metal leads, each lead including an inner end segment beginning at an inner end of the lead;
a nonconductive layer on the inner end segment of at least a first one of the leads and set back from its inner end;
an electrically conductive layer on a surface of the nonconductive layer, wherein the nonconductive layer electrically isolates the electrically conductive layer from the respective lead upon which the nonconductive layer is positioned; and
a semiconductor chip separately electrically coupled to the inner end segment and the electrically conductive layer of the first lead, wherein a second one of the leads also is electrically coupled to the electrically conductive layer;
wherein the electrically conductive layer contacts the second lead.

30. A semiconductor package comprising:
a plurality of first leads and a plurality of second leads, each said first lead being associated with at least one of the second leads;
a plurality of separate dielectric layers, each said dielectric layer on a first surface of only one said first lead;
a plurality of separate electrically conductive layers, each said electrically conductive layer on a surface of one of the dielectric layers;
a semiconductor chip electrically coupled to the first leads, and electrically coupled to respective ones of the second leads through the electrically conductive layer on the first lead associated with the respective second lead.

31. The semiconductor package of claim 30, wherein the first leads extend closer to a center of the semiconductor chip than the second leads.

32. The semiconductor package of claim 30, wherein at least one of the second leads is between each pair of the first leads.

33. The semiconductor package of claim 30, wherein at least one of the first leads is associated with a plurality of the second leads, and the plurality of the second leads are electrically coupled to the semiconductor chip through respective ones of plural said electrically conductive layers on the associated first lead.

34. A semiconductor package comprising:
   a plurality of first leads and a plurality of second leads, each said first lead being associated with at least one of the second leads;
   a plurality of separate dielectric layers, each said dielectric layer on a first surface of an associated first lead;
   a plurality of separate electrically conductive layers, each said electrically conductive layer on a surface of an associated one of the dielectric layers;
   a semiconductor chip electrically coupled to the first leads, and electrically coupled to the respective second leads through the electrically conductive layer on the dielectric layer associated with the first lead with which the respective second lead is associated, wherein at least one of the second leads is between each pair of the first leads.

35. The semiconductor package of claim 34, wherein the first leads extend closer to a center of the semiconductor chip than the second leads.

36. The semiconductor package of claim 35, wherein at least one of the first leads is associated with a plurality of the second leads, and the plurality of the second leads are electrically coupled to the semiconductor chip through respective ones of plural said electrically conductive layers on the associated first lead.

37. The semiconductor package of claim 34, wherein at least one of the first leads is associated with a plurality of the second leads, and the plurality of the second leads are electrically coupled to the semiconductor chip through respective ones of plural said electrically conductive layers on the associated first lead.

38. A leadframe comprising:
   a plurality of metal leads adjacent a central die mounting region of the leadframe, each said lead having an inner end;
   a metal strip transverse to the leads between the inner end of the leads and the central die mounting region, wherein the metal strip is integral with and connected between metal tie bars, said tie bars extending from adjacent corners of the leadframe toward the central die mounting region;
   a nonconductive layer on the metal strip, wherein a portion of the metal strip is exposed adjacent the nonconductive layer; and
   a conductive layer on the nonconductive layer and electrically isolated from the metal strip by the nonconductive layer.

39. The leadframe of claim 38, wherein a die pad is located in the die mounting region inward of the metal strip.

40. The leadframe of claim 39, wherein a semiconductor chip is in the chip mounting region and is separately electrically coupled to the exposed portion of the metal strip and to the conductive layer.

41. A semiconductor package comprising:
   a plurality of metal leads adjacent a central die mounting region, each said lead having an inner end;
   a metal strip transverse to the leads between the inner end of the leads and the central die mounting region, wherein the metal strip is integral with and connected between metal tie bars, said tie bars extending inward toward the central die mounting region from adjacent corners of the semiconductor package;
   a nonconductive layer on the metal strip, wherein a portion of the metal strip is exposed;
   a conductive layer on the nonconductive layer and electrically isolated from the metal strip by the nonconductive layer;
   a semiconductor chip located in the central die mounting region and separately electrically coupled to the exposed portion of the metal strip and to the conductive layer; and
   an encapsulating material covering the semiconductor chip, the metal strip, the nonconductive layer, the conductive layer, and at least a portion of the leads.

42. The semiconductor package of claim 41, further comprising a plurality of the metal strips, each located adjacent a side of a die pad in the central die mounting region and each including at least one said nonconductive layer.

43. The semiconductor package of claim 41, wherein the semiconductor chip is electrically coupled to at least one of the leads by a bond wire.

44. The semiconductor package of claim 41, wherein the semiconductor chip is electrically coupled to the exposed portion of the metal strip by a bond wire.

45. The semiconductor package of claim 41, wherein the exposed portion of the metal strip is electrically coupled to at least one of the leads by a bond wire.

46. The semiconductor package of claim 41, wherein the semiconductor chip is electrically coupled to the conductive layer by a bond wire, and the conductive layer is electrically coupled to at least one of the leads by a bond wire.

* * * * *